United States Patent
Menkara

(10) Patent No.: US 9,644,817 B2
(45) Date of Patent: May 9, 2017

(54) PHOSPHOR SHEETS

(71) Applicant: Hisham Menkara, Kennesaw, GA (US)

(72) Inventor: Hisham Menkara, Kennesaw, GA (US)

( * ) Notice: Subject to any disclaimer, the term of this patent is extended or adjusted under 35 U.S.C. 154(b) by 412 days.

(21) Appl. No.: 14/172,991

(22) Filed: Feb. 5, 2014

(65) Prior Publication Data

US 2014/0226335 A1 Aug. 14, 2014

Related U.S. Application Data

(60) Provisional application No. 61/762,858, filed on Feb. 9, 2013.

(51) Int. Cl.
| | |
|---|---|
| *F21V 7/04* | (2006.01) |
| *F21V 9/16* | (2006.01) |
| *C09K 11/02* | (2006.01) |
| *C09K 11/77* | (2006.01) |
| *F21K 9/64* | (2016.01) |
| *H01L 33/50* | (2010.01) |
| *F21Y 115/10* | (2016.01) |

(52) U.S. Cl.
CPC ............. *F21V 9/16* (2013.01); *C09K 11/02* (2013.01); *C09K 11/7734* (2013.01); *C09K 11/7774* (2013.01); *F21K 9/64* (2016.08); *F21Y 2115/10* (2016.08); *H01L 33/505* (2013.01)

(58) Field of Classification Search
CPC .......... H01L 2933/0041; H01L 33/502; H01L 2224/48137; F21K 9/56; F21V 9/16; F21V 3/0481
USPC .................. 362/601, 606, 615–629
See application file for complete search history.

(56) References Cited

U.S. PATENT DOCUMENTS

| | | | |
|---|---|---|---|
| 2005/0224830 A1 | 10/2005 | Blonder et al. | |
| 2006/0255711 A1* | 11/2006 | Dejima | G02B 6/0023 313/485 |
| 2009/0141474 A1* | 6/2009 | Kolodin | F21K 9/135 362/84 |
| 2009/0173957 A1 | 7/2009 | Brunner et al. | |

(Continued)

FOREIGN PATENT DOCUMENTS

| | | |
|---|---|---|
| JP | 2006348262 A | 12/2006 |
| JP | 2007059898 A | 3/2007 |

OTHER PUBLICATIONS

International Search Report for related Application PCT/US2014/015407, Jun. 10, 2014.

*Primary Examiner* — William Carter
(74) *Attorney, Agent, or Firm* — Moore Patents; David Dreyfuss

(57) ABSTRACT

A light converter, and lights and displays incorporating the light converter are disclosed together with methods of making the light converter. The light converter has a substrate having a first layer of phosphor particles disposed on an area of one surface of the substrate. The first layer has a thickness of about 1 monolayer of phosphor particles, and the phosphor particles in the first layer form a uniform and dense layer. The thickness of the substrate can be between about 25 μm and about 500 μm in embodiments intended to be flexible and between about 0.5 mm and 2 mm in embodiments that can be formed into rigid shapes. The screen weight of the phosphor particles is between about 0.5 mg/cm$^2$ and about 40 mg/cm$^2$. The substrate can include a base layer and an adhesive layer.

20 Claims, 7 Drawing Sheets

A

B

(56) References Cited

U.S. PATENT DOCUMENTS

2010/0027293 A1* 2/2010 Li .................... G02B 6/002
 362/619
2011/0156072 A1 6/2011 Ling

* cited by examiner

Prior Art                    Phosphor Sheet

A

B

C

A

B

C

A

B

PHOSPHOR SHEETS

CROSS-REFERENCE TO RELATED APPLICATION

This application claims priority to U.S. Provisional Patent Application No. 61/762,858, filed on Feb. 9, 2013 which is incorporated herein by reference for all purposes.

FIELD OF THE INVENTION

One or more embodiments of the present invention relate to phosphors for use in solid-state lighting and display devices.

BACKGROUND

The performance and cost of light emitting diodes (LEDs) have improved to the point where they are now replacing incandescent, fluorescent, compact fluorescent, and halogen lamps in lighting applications. LEDs have many advantages over other light sources including long life, ruggedness, low power consumption, and small size. LEDs are near-monochromatic light sources, and are available with emission peaks from the UV through the visible and into the infrared. A typical bandwidth for an LED is less than about 50 nm. Accordingly, in order to simulate white light, it is necessary to generate a broader range of wavelengths than is emitted by a single LED. There are two common solutions to this problem. One approach is to arrange individual red, green, and blue (R, G, B) LEDs in close proximity and then diffuse and/or mix the light emitted by groups of at least three LEDs. A second approach is to combine a short-wavelength (UV or blue) LED with broadband fluorescent compounds or phosphors that convert part or all of the LED light into longer wavelengths.

Using separate R, G, B light emitting devices introduces several problems. The different LED colors are typically provided by LEDs made of different semiconductor materials, requiring different operating voltages and complex drive circuitry. The resulting emission spectrum consists of three relatively narrow color bands, and the result is a poor approximation of natural daylight (approximately a broadband blackbody radiation that arrives at the Earth surface from the Sun). Color rendering can be compromised due to metamerism effects where color appearance can vary according to the illumination wavelengths.

While white light fixtures and devices using RGB LEDs have been offered commercially, the single-LED-plus-phosphor solution has generally emerged as the preferred way to use LEDs for general white-lighting applications. Only a single type of LED (UV or blue) is required together with one or more fluorescent or phosphorescent materials. Typical phosphors can efficiently convert at least a portion of the incident light into relatively broadband emission at longer wavelengths. The converted light typically has peak emission in the green to yellow with a bandwidth of at least 100-150 nm. A typical device is configured to mix some unconverted blue light with broadband yellow-green converted light to give a much better approximation of blackbody white light than can be obtained using RGB LEDs. The overall device (one LED plus phosphor) can be more compact, simpler in construction, and lower in cost than the 3-LED device, and the color rendering can be superior as well.

Various materials are available commercially for use as phosphors for solid state lighting. The phosphors are generally inorganic powders with up to a few percent of a rare earth material such as cerium or europium in a base crystalline material. Common base materials include garnets, silicates, nitrides, and sulfides. The doped material is typically ground into a micron-sized powder for use in lighting applications.

Commercial devices use one or several mixed phosphors to convert a portion of blue LED emission to green, yellow, orange, and red. Some of the blue light from the LED is transmitted through the phosphors and mixed with the yellow phosphor emission, thereby resulting in a perceived white light.

Phosphors can be prepared by mixing the ground material with a polymer such as an epoxy or silicone to create a wet slurry that can be dispensed, painted, or printed on the surface of the LED. Alternatively, though less commonly, the wet can be coated onto a "remote" phosphor plate (at some distance from the LED) or used to create a molded plastic part that incorporates phosphor particles.

SUMMARY OF THE INVENTION

A light converter, and lights and displays incorporating the light converter are disclosed together with methods of making the light converter. The light converter has a substrate having a first layer of phosphor particles disposed on an area of one surface of the substrate. The first layer has a thickness of about 1 monolayer of phosphor particles, and the phosphor particles in the first layer form a uniform and dense layer. The thickness of the substrate can be between about 25 µm and about 500 µm in embodiments intended to be flexible and between about 0.5 mm and 2 mm in embodiments that can be formed into rigid shapes. The screen weight of the phosphor particles is between about 0.5 mg/cm$^2$ and about 40 mg/cm$^2$. The substrate can include a base layer and an adhesive layer. The adhesive layer can be a tacky surface or a polymethylmethacrylate or silicone adhesive. The substrate can also have a reflective layer and/or a layer of pressure-sensitive adhesive.

In some embodiments, a second monolayer of phosphor particles is disposed on a second side of the substrate. A second monolayer of phosphor particles can also be disposed on the first layer with an intervening second adhesive layer.

In some embodiments, the index of refraction of the substrate is substantially the same as the index of refraction of a material encapsulating a light source. Exemplary substrate materials include polymers such as PET and silicone as well as rigid materials such as metals and glasses.

The phosphor particles can be selected to absorb light having a peak wavelength between about 360 nm and about 490 nm and emit light having a peak emission wavelength longer than the peak wavelength of the absorbed light. The phosphor particles can include two or more materials, each material having a peak emission wavelength distinct from the peak emission wavelength of each other material. The two or more materials can be mixed within a phosphor layer, disposed in separate phosphor layers, or disposed on separate and discrete areas of the phosphor sheet.

In some embodiments a layer of a non-phosphor optical material is disposed on the first layer of phosphor particles, wherein the non-phosphor optical material can be one or more of photonic crystals, dielectric nanostructures, and metallic surface plasmon nano-structures.

Methods of forming a light converter are disclosed. A transparent, reflective, or diffuse substrate having an adhesive surface is provided, and at least a first monolayer of phosphor particles is formed on the adhesive surface of the substrate. The adhesive surface can be formed by heating the substrate until the surface is tacky, or by explicitly forming an adhesive layer on an area of the substrate. In some embodiments, a second adhesive layer is formed on the first monolayer of phosphor particles, and a second layer of phosphor particles is formed on the second adhesive layer. In some embodiments, the methods further comprise forming a second adhesive layer on the an area of the substrate, and forming a second layer of phosphor particles on the second adhesive layer. The phosphor monolayers can be formed by dry dusting, spraying, or brushing phosphor particles onto the adhesive layer(s). In some embodiments the methods can be implemented in a roll-to-roll manufacturing line.

Light emitting devices are disclosed comprising the light converter. The light emitting devices further comprise a light source having a peak emission wavelength between about 360 nm and about 490 nm. The light source can be an LED or laser (optionally scanned across an area of phosphor particles on the light converter.

DETAILED DESCRIPTION

Figure 1:
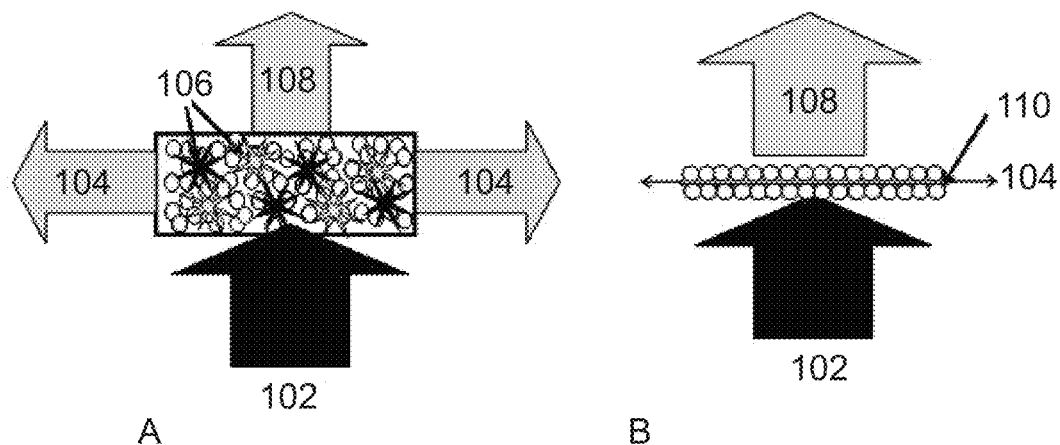
FIG. 1 shows a comparison of prior art phosphors and phosphor sheets according to some embodiments.
Figure 1:
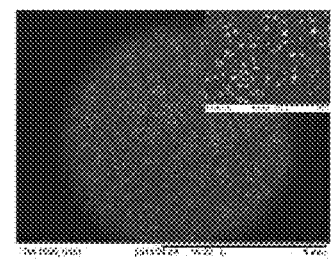
Figure 1:
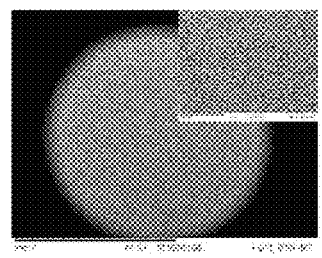
Figure 1:
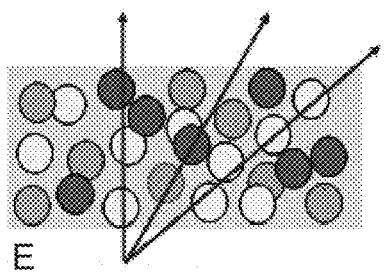
Figure 1:
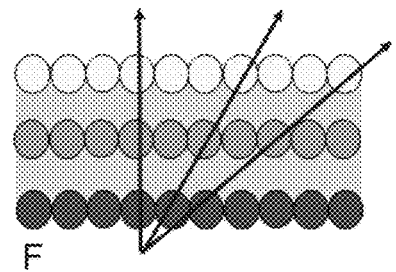

Before the present invention is described in detail, it is to be understood that unless otherwise indicated this invention is not limited to specific light sources, phosphors or specific layer stacks. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the term "about" is used in front of a numerical value, the value is deemed to be within ±10% of the numerical value. Where the term "sub-stantially the same as" is used, the difference between the two quantities compared is within ±10% of either numerical value.

As used herein, the term "fluorescent" generally refers to a material property wherein photons or other particles are absorbed at one energy, and photons are re-emitted at a lower energy (longer wavelength) with little or no time delay (i.e., any time delay is of no practical consequence for the particular application). The material can be referred to as a "fluorophor."

As used herein, the term "phosphorescent" generally refers to a material property wherein photons or other particles are absorbed at one energy, and photons are re-emitted at a lower energy (longer wavelength) with a time delay (i.e., there is a "persistence" or "decay" time associated with the re-emission process). The material can be referred to as a "phosphor." In most solid state lighting applications, the decay time has no importance, and the term "phosphor" is used generically whether there is significant persistence or not.

As used herein, the term "luminescent" generally refers to a material property whereby a material emits light. Both fluorophors and phosphors are luminescent, emitting light after being excited by the absorption of energy from photons, electrons, or other energetic particles.

As used herein, the notation $M_x \ldots N_y{:}D$ denotes the atomic composition of a phosphor formulation, where M and N (possibly with additional atoms) denote chemical elements, x and y indicate the relative stoichiometry for a base material, and D indicates a "dopant" present in quantities up to a few percent. Phosphors and fluorophors typically function based on a "forbidden" electronic transition in the dopant atom, and the base material serves to support the dopant and broaden the bandwidth of the emitted light.

As used herein, the term "conversion efficiency" refers to a ratio of total lumens as emitted, reflected, or transmitted by, from, or through a phosphor layer relative to the radiant watts of blue or ultraviolet light used as an excitation source and illuminating the phosphor layer. The specific measurement details will vary according to the geometry of a specific embodiment. For example, in the embodiment of FIG. 3B using a blue LED, the radiant watts output by the LED without a phosphor sheet in place can be measured first. Then the total lumens (i.e., light transmitted through the phosphor sheet plus light converted by the phosphor sheet expressed in lumens) can be measured. The ratio of these two numbers is the conversion efficiency. The units of conversion efficiency are expressed herein in $lm/W_{rad}$, i.e., the apparent visual luminosity in lumens for a given radiant power impinging on a phosphor from a light source. The total lumens is a measure of the white light that is provided as useful illumination. For blue LEDs, the light typically includes transmitted blue light plus phosphor converted light. For UV LEDs, transmitted light is not useful as visible light illumination, so only the phosphor converted light would be measured.

As used herein, the terms "CIE x" and "CIE y" refer to color coordinates on the color scale established by the International Commission on Illumination (Commission Internationale de l'éclairage or CIE) in 1931. The apparent color of a light source or surface can be expressed in terms of two coordinates on the CIE chromaticity diagram.

As used herein, the term "color rendering index" or "CRI" refers to a quantitative measure of the ability of a light source to reproduce the colors of various objects faithfully in comparison with an ideal or natural light source (i.e., blackbody illumination approximating normal daylight).

The highest value is 100, and values close to 100 indicate that a light source can provide good color rendering.

As used herein, the term "correlated color temperature" or "CCT" refers to the temperature of an equivalent blackbody radiation source whose perceived color most closely resembles that of a given light source at the same brightness and viewing conditions. A CCT can be calculated for any CIE chromaticity coordinate, but the number is typically only useful when describing a light source which is nearly white in appearance. The CCT for natural daylight can vary in the range from about 5000 K to about 6500 K. The sun itself has a CCT at the Earth surface of about 5800 K. Various indoor and photographic light sources generally have CCTs between about 3000 K and about 6000 K.

As used herein, the term "screen weight" refers to the areal density of phosphor particles on a surface. Screen weight has units of weight (of phosphor) per unit area and is commonly expressed in $mg/cm^2$.

As used herein, the term "monolayer" refers to a layer of particles that is one particle thick and in a "uniform and dense layer" on a substrate surface. A monolayer of phosphor particles can be prepared by applying a layer of an adhesive to a substrate followed by applying phosphor particles; the phosphor particles stick to the adhesive layer in a uniform and dense layer upon contact. As there may be a distribution of particle sizes, a "uniform and dense layer" means that particles are generally in "close proximity" to each other but may not exhibit any particular ordering (i.e., they may not be arranged in a hexagonal close-packed pattern such as could be achieved with uniform spherical particles). "Close proximity" means that the average distance between neighboring particles on a surface is generally less than the largest dimension of the largest particle present on the surface. The term "about a monolayer" is used herein to mean that the monolayer can have some imperfections in the form of either voids having no phosphor particles or scattered locations where a second particle is stacked on top of the monolayer. Such imperfections do not substantially alter the measured screen weight of the phosphor layer.

The present inventor recognized that prior art processes for applying phosphors to solid state lighting devices are time- and labor-intensive and suffer from the following deficiencies:

1. They require polymer liquid handling, phosphor mixing, and coating.
2. They require polymer curing (heat or UV).
3. They require continuous stifling to prevent phosphor settling within the liquid polymer to avoid non-uniform phosphor coating.
4. They generate waste in the form of non-recyclable liquid paste that sticks to mixing tools and processing components.
5. The applied coatings are not easily removed and can render LEDs unusable when too much or too little phosphor is applied.
6. There is no design flexibility for the end user, because the phosphor/polymer mixture can only be applied and cured once (either on the LED die or on a remote surface).
7. The phosphor/polymer layers tend to be thick and increase light scattering;
8. Color non-uniformity can appear as a function of angle because of mixed phosphor particles randomly distributed throughout the polymer rather than arranged in discrete densely packed monolayers.
9. Phosphor particles embedded in a matrix receive less illumination from incident light than particles at a substrate surface, because some light is reflected at the matrix-air boundary. The reduced illumination results in losses in overall optical efficiency. The matrix is typically also a poor thermal conductor, and heat dissipation from the phosphor can be inefficient. (Heat dissipation can be a serious problem for higher power devices, since the most efficient LED/phosphor combinations still dissipate more than half of the input electrical power as heat.)

These deficiencies are overcome by the instant light converter, and lights and displays incorporating the light converter. The light converter comprises a substrate having a first layer of phosphor particles disposed on an area of one surface of the substrate. The first layer has a thickness of about 1 monolayer of phosphor particles, and the phosphor particles in the first layer form a uniform and dense layer. The thickness of the substrate can be between about 25 µm and about 500 µm in embodiments intended to be flexible and between about 0.5 mm and 2 mm in embodiments that can be formed into rigid shapes. The screen weight of the phosphor particles is between about 0.5 $mg/cm^2$ and about 40 $mg/cm^2$. The substrate can include a base layer and an adhesive layer. The adhesive layer can be a tacky surface or a polymethylmethacrylate or silicone adhesive. The substrate can also have a reflective layer and/or a layer of pressure-sensitive adhesive.

The light converter (or phosphor sheet) comprises very thin, uniform and dense luminescent layers having reduced light scattering, no color variations with angle, and easily customizable form factors. The substrate thickness can be between about 25 µm and about 500 and the phosphor can be applied at an areal density of between about 1 $mg/cm^2$ and about 50 $mg/cm^2$. In some embodiments the substrate thickness can be between about 25 µm and about 50 µm. In some embodiments the substrate thickness can be between about 50 µm and about 75 µm. In some embodiments the substrate thickness can be between about 75 µm and about 100 µm. In some embodiments the substrate thickness can be between about 100 µm and about 200 µm. In some embodiments the substrate thickness can be between about 200 µm and about 300 µm. In some embodiments the substrate thickness can be between about 300 µm and about 400 µm. In some embodiments the substrate thickness can be between about 400 µm and about 500 µm. The resulting phosphor layers can be densely packed such that particles are generally in close proximity to each other. Single monolayers of particles can be used, or in some embodiments, stacks of two or more monolayers or two or more sheets can be combined in a finished device. The light converter can be prepared using dry phosphor powders without any phosphor/polymer mixing or handling. The phosphor application process generates almost no waste and all unused materials can be recycled and reused. The light converter can be prepared and tested separately from the light source and can be custom cut in various shapes and sizes for direct application to a light source such as an LED or to a remote surface.

In some embodiments, the light converter can be printed or printed on and patterned using conventional digital printing (e.g., ink jet), screen-printing, die-cutting, and coating equipment.

In some embodiments, an adhesive backing layer can be applied to the light converter to facilitate attachment to various surfaces and optical components. The light converters can provide a lamp designer with numerous degrees of freedom. For example, a light converter can be applied either directly on the LED or to a remote and/or curved surface away from the light source.

FIG. 1 shows some of the properties of some embodiments of light converters compared to prior art phosphors used in lighting. FIGS. 1A, 1C, and 1E show the prior art, while FIGS. 1B, 1D, and 1F show embodiments of the light converters disclosed herein. FIGS. 1A and 1B show schematically the benefits of the light converters. The incident light 102 hits the light converter from the bottom. The prior art uses thicker phosphor layers that exhibit significant losses due to waveguide (light piping) effects 104 that direct a portion of the incident light laterally through the phosphor layer plus additional losses due to trapping and scattering 106 within the material as shown in FIG. 1A. The net output 108 is reduced by these loss mechanisms. These losses are substantially reduced in thin phosphor layers as shown in FIG. 1B. The substrate 110 can be 10 to 20 times thinner than prior art phosphors applied from phosphor particles mixed with a binder. Trapping and scattering losses are negligible, and light piping losses 104 are greatly reduced. FIGS. 1C and 1D compare microscopic images of the prior art (randomly distributed phosphor particles within a polymer matrix) and thin phosphor sheets having layers of close-packed particles, respectively. FIGS. 1E and 1F show schematically how the close-packed arrangements of phosphor particles can result in improved color uniformity with angle. Excitation light rays (e.g., blue light from a blue LED) passing through a conventional phosphor matrix interact with different numbers of each phosphor type (color), resulting in inconsistent light conversion by the phosphor particles. For example, FIG. 1E illustrates three rays encountering different numbers of phosphor particles of each type. In contrast, light rays consistently interact with the same number of each phosphor type arranged in close-packed monolayers according to embodiments of the present invention. FIG. 1F illustrates three rays encountering one phosphor particle of each type. The multiple layers shown in FIG. 1F can be assembled from individual monolayers on one or both sides of stacked substrates, or the layers can be formed by sequential deposition of adhesive layers and phosphor particle layers.

In the prior art, the absorption of incident blue light rays and the amount of phosphor light conversion can depend on the angle of incidence of the excitation light and the relative flux density distribution inside the phosphor matrix. When the phosphor is placed as a layer of close-packed particles on the surface of a substrate, the absorption of incident light and the phosphor conversion can be independent of both the angle of incidence for the excitation light and the relative flux density distribution below the substrate surface, since all of the phosphor is on the substrate surface. FIG. 1F shows this effect schematically. A blue light ray will be generally subjected to the same phosphor conversion efficiency independently of angle or position on the phosphor sheet.

Figure 2:
FIG. 2 shows three arrangements of two phosphor materials in phosphor sheets.
Figure 2:
Figure 2:

The layer control possible with embodiments of light converters enables a variety of layer configurations as illustrated in FIG. 2. FIG. 2 shows three non-limiting examples of arrangements of two phosphors in two monolayers on a phosphor sheet. FIG. 2A shows the two phosphors randomly mixed and applied to the sheet. FIG. 2B shows two monolayers, each having a single phosphor composition. These can be applied, for example, to the two sides of a thin substrate sheet, or formed from a stack of two thin sheets each coated on one side with a monolayer of phosphor particles. FIG. 2C shows tiled or patterned regions, where each tile or region has a single phosphor composition. It is readily apparent that these are three of many possible arrangements of two or more phosphors on a single sheet. Further, in some embodiments, two or more phosphor sheets can be stacked to create additional effects. The embodiments illustrated in FIGS. 2A and 2C could be implemented in a single monolayer.

In some embodiments the light converters can be used as a display surface. For example, the light converter can be illuminated by a scanned laser to create an image. Monochrome images can be created by scanning a light converter comprising a single phosphor type. Color images can be created by scanning a light converter comprising patterns of differently colored phosphors. Depending on the application, the patterns can be images themselves (icons, characters, words, etc.) or they can be arranged in pixel arrays as for a color cathode ray tube.

Figure 3:
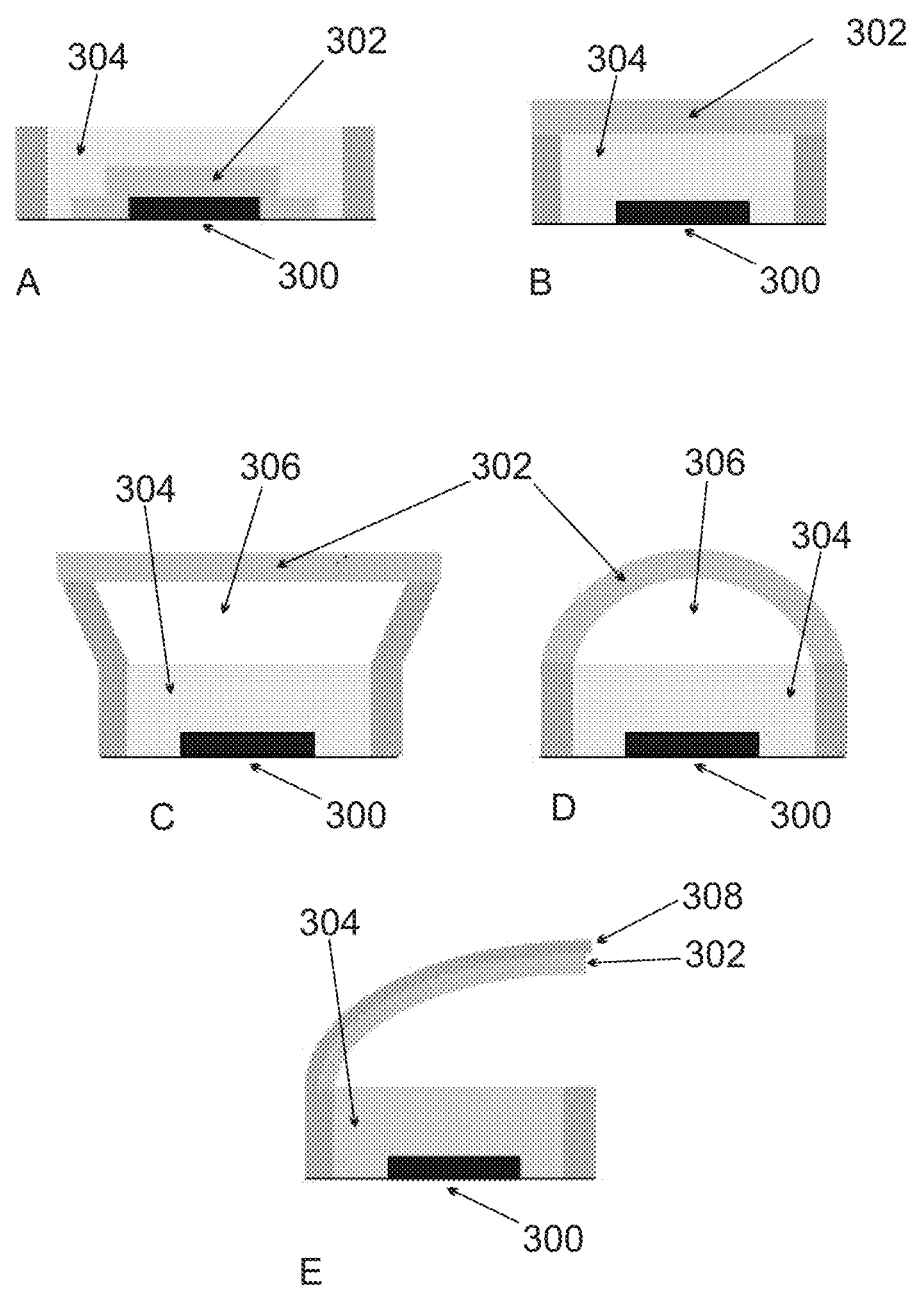
FIG. 3 shows phosphor sheets applied to LED light sources in five different configurations.

Similarly, the light converters can be disposed in a variety of positions relative to LEDs. Examples of disposition are shown in FIG. 3. FIG. 3A shows a light converter 302 wrapped directly around a single LED die 300, optionally with an encapsulant 304 over the phosphor sheet. This arrangement results in a device similar to devices having a phosphor painted directly onto an LED die. FIG. 3B shows a light converter 302 applied to an already-encapsulated LED. While illustrated with a flat encapsulant surface, a similar arrangement can be used for curved encapsulant surfaces such as those used as lenses to narrow the emission direction of light from LEDs. FIGS. 3C and 3D show two examples of remote phosphor arrangements where a light converter 302 is disposed remotely from the LED 300 (i.e., with an air gap 306). Remote phosphor configurations can be used to separate the design problems of dissipating heat generated by the LED from heat generated by the phosphor light conversion process. Remote phosphors can also help a lighting designer create tube- and bulb-type assemblies for incandescent and fluorescent lamp replacements, or to create unique luminaire designs.

Figure 4:
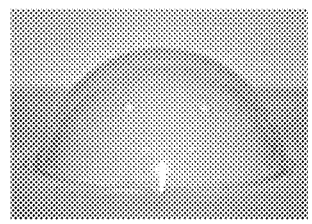
FIG. 4 shows three examples of thermoformed phosphor sheets.
Figure 4:
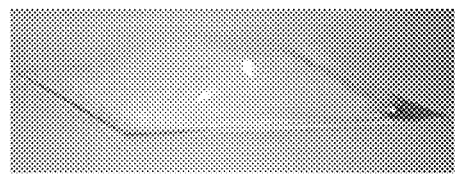
Figure 4:
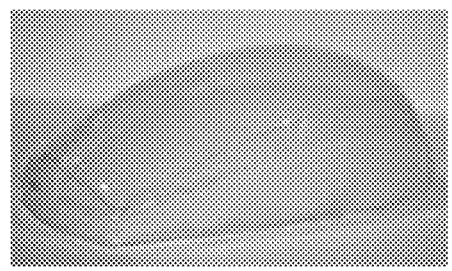

In some embodiments, light converters can be thermoformed or vacuum formed into a rounded or complex three-dimensional shape such as those shown in FIGS. 3D and 3E and the additional shapes shown in FIGS. 4A-C. For example, FIG. 3D shows a cross section that could be either a cylindrical or spherical shape coated with a monolayer of phosphor. The shape can be formed before or after coating with the phosphor. In some embodiments, such three-dimensional shapes are formed from thicker and less flexible substrates (e.g., 0.5-2 mm) that have sufficient stiffness to hold the shape after forming. In some embodiments the substrate thickness can be between about 0.5 mm and about 0.75 mm. In some embodiments the substrate thickness can be between about 0.75 mm and about 1 mm. In some embodiments the substrate thickness can be between about 1 mm and about 1.5 mm. In some embodiments the substrate thickness can be between about 1.5 mm and about 2 mm. In some embodiments the substrate thickness can be between about 0.5 mm and about 0.75 mm.

In some embodiments, rather than first forming a light converter and then assembling it into a finished device, the substrate is formed into a device or a portion of a device (for example, as an encapsulant, lens, reflector, tube, or bulb surface), and the monolayer of phosphor particles is applied to the device or portion of a device. A monolayer of phosphor particles can be applied to any transparent or diffuse scattering surface. In these embodiments, the light converter comprises the substrate as formed into a device plus the monolayer of phosphor particles applied thereto.

In some embodiments, the light converters can be used in a reflective mode. A light converter can be applied to a reflective surface, or a reflective layer can be coated onto one side of the substrate material. FIG. 3E shows one example of a remote phosphor configured to operate with light reflected from a phosphor (or a reflective surface behind the phosphor). A portion of the incident light can be reflected from the phosphor sheet 302 (or a reflective surface 308 to which the phosphor sheet is attached), and a portion of the incident light is converted by the phosphor. As with transmissive phosphor sheets, reflective sheets can be thermoformed or vacuum formed into rounded or complex three-dimensional shapes before or after coating with phosphor particles, reflective layers or both.

The substrate for a light converter can be made from a variety of materials according to the needs of particular applications. In some embodiments, where high temperatures are not expected, low-cost transparent polymers such as polyethylene terephthalate (PET), polymethylmethacrylate, polycarbonate, and similar polymers and copolymers can be used. In some embodiments, transparent hydrocarbon rubbers such as polyurethanes and polyisoprenes can be used. For high power devices which can exceed the safe operating temperatures for hydrocarbon-based materials, fluorinated plastics and rubbers as well as silicone-based materials (plastics and rubbers) can be used.

Figure 5:
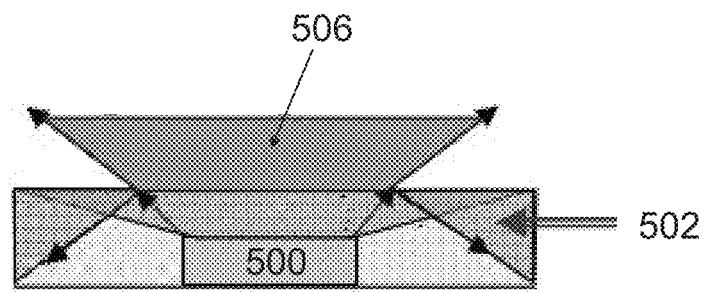
FIG. 5 shows the benefits of an indexed-matched substrate for a phosphor sheet.
Figure 5:
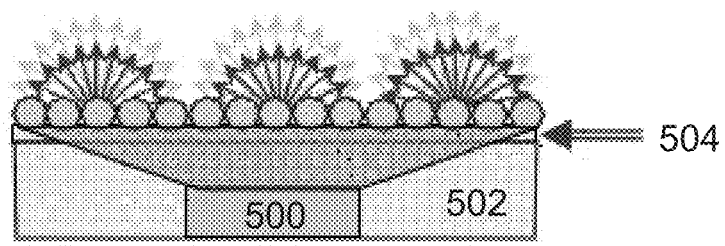

In some embodiments, the substrate material has an index of refraction which is matched to the lens, covering, or encapsulant on a light source such as an LED. Index matching can reduce or eliminate light reflection at intermediate surfaces and ensure that substantially all of the light emitted by the light source reaches the phosphor layer. The principle is illustrated in FIG. 5. FIG. 5A shows an LED 500 embedded in an encapsulant 502 with a flat surface. Reflection paths are shown by arrows. A portion of the light is lost to internal reflections within the encapsulant, and a portion of the light is emitted in an "escape cone" 506 FIG. 5B shows the same encapsulated LED with a phosphor sheet 504 having a substrate index-matched to the encapsulant 502. The internal reflections are substantially eliminated, and the phosphor surface becomes a highly conformal Lambertian light source as illustrated. Sample assemblies built in this way with different phosphors have exhibited net power gains (total radiant watts out/radiant blue watts in) of 112-131% and quantum gains (total photons out/blue photons in) of 124-162%.

In some embodiments, the light converters can be laminated on one or both sides using flexible or rigid sheets to protect the phosphor sheet during handling and use.

In some embodiments, the phosphor particles can be coated onto one or both sides of the substrate. The phosphor particles can be applied as a pure powder or mixed with a suitable transparent binder. The choice of binder is limited only by the intended use. For example, a polymethylmethacrylate adhesive can be used at lower temperatures, and various silicone-based adhesives can be used at higher temperatures as general purpose adhesives. Adhesives can be used both as a binder for the phosphor particles and as a means to secure the phosphor sheet to another surface. For example, the phosphor particles can be embedded in a binder which secures them to one side of a phosphor sheet, and the other side of the phosphor sheet can have a transparent contact adhesive protected by a peelable release sheet for securing the sheet to a surface. In some embodiments, the substrate is coated with a uniform and tacky adhesive layer, and the phosphor can be applied by dusting, spraying, or brushing the phosphor in powder form. The powder can be prepared by grinding a phosphorescent material. In some embodiments the powder has an average particle size of between about 5 µm and about 15 µm. Any excess powder not sticking to the adhesive can be collected and recycled. The resulting layer of phosphor can approximate a close-packed monolayer, although the packing density may be limited by the particle size, shape, and size distribution. (Phosphors are typically ground to a powder which comprises particles having somewhat irregular shapes and a distribution of sizes.)

In some embodiments, two, three, or more phosphor layers can be formed on one side of a substrate by sequential deposition of adhesive layers and monolayers of phosphor particles. Depending on the intended use, the successive layers can each coat the entire substrate, or individual layers can be patterned by applying adhesive to selected areas of the substrate.

In some embodiments, the substrate for the light converter can be made using materials with higher thermal conductivities ($T_c$) such as glass, quartz, sapphire, and metals (e.g., for reflectors). In some embodiments, higher $T_c$ substrates can be attached or laminated directly to one or both sides of the phosphor sheet in order to enable better phosphor heat dissipation for very high power LED or laser applications.

In some embodiments, the exposed phosphor particles can be coated or encapsulated using a wide variety of optical or thermal films and structures in order to enhance their performance for specific applications. For example, a thin layer of aluminum oxide can be coated on the exposed surface of the phosphor particles in order to both protect the phosphor from the environment and to improve the sheet's optical and/or thermal properties. In another example, a thin layer of silicone can be coated on the exposed surface of the phosphor particles in order to both protect the phosphor from the environment and to improve the sheet's optical and/or thermal properties.

In some embodiments, the exposed phosphor particles can be covered using patterned non-phosphor optical structures in order to manipulate absorbed/reflected light, increase light extraction, or fine-tune the phosphor emission color and bandwidth. Examples of such optical structures include photonic crystals, dielectric nanostructures, and metallic surface plasmon nano-structures.

EXAMPLES

Figure 6:
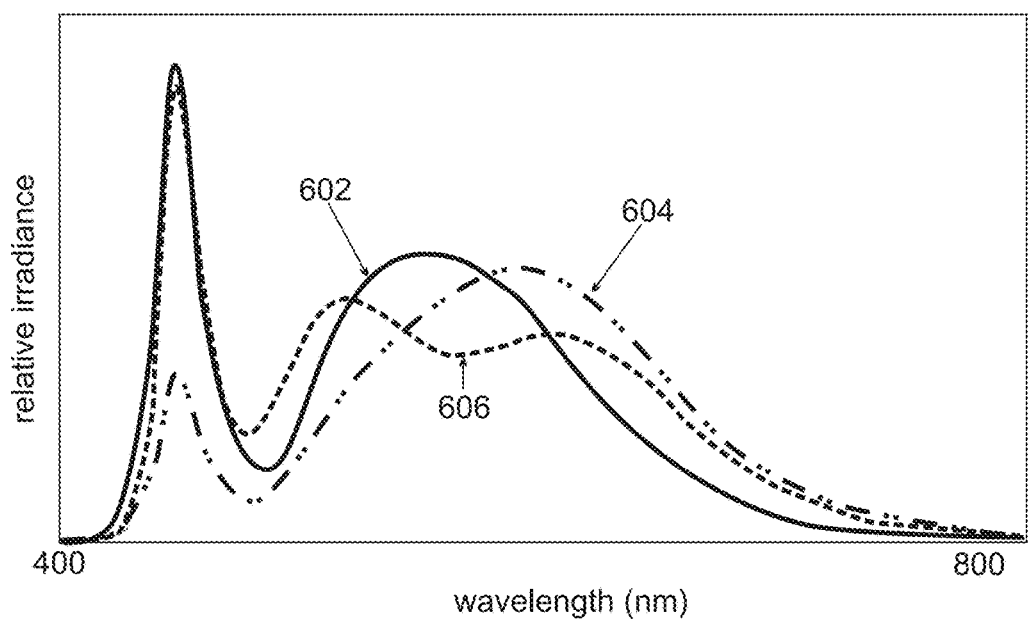
FIG. 6 shows spectra for various phosphors illuminated by a 450 nm LED light source.

FIG. 6 shows the net spectral output for a series of example phosphor sheets according to embodiments of the present invention. The phosphor sheets are illuminated by an LED light source with a peak wavelength of 450 nm. Table 1 shows typical conversion efficiency in lumens/watt, color coordinates (CIE x and CIE y), color rendering index (CRI) and correlated color temperature (CCT) for each of the first three examples, prepared as described below.

TABLE 1

| Example | Conv. eff. (lm/W) | CIE x | CIE y | CRI | CCT |
| --- | --- | --- | --- | --- | --- |
| 1 | 300 | 0.3398 | 0.3563 | 74.1 | 5217 K |
| 2 | 273 | 0.4345 | 0.4094 | 80.4 | 3084 K |
| 3 | 200 | 0.3326 | 0.3448 | 95.7 | 5495 K |

Example 1

A thin polyester (PET) substrate was coated with an ACRYLIC® adhesive on both sides to a total thickness of about 150-175 µm. A yellow phosphor consisting of $(Y,Gd)_3Al_5O_{12}$:Ce was brushed or dusted/sprayed on the two adhesive surfaces until full coverage was achieved and no more phosphor particles would stick to the surface. The loose particles were brushed or blown off and the phosphor sheet was tested by placing it on top of a blue LED. The resulting spectrum is shown in FIG. 6 as curve 602, and the color performance is given in Table 1 above. The relative irradiance has units of watts per unit area per unit wavelength. The spectral curve is typical of many commonly used in solid state lighting applications. The conversion efficiency is high, and a significant amount of blue light is left unconverted. The color temperature is relatively high, but the CRI is limited, because there is relatively little red light in the spectrum and the color is blue-white.

Example 2

A thin PET substrate was coated with an ACRYLIC adhesive on both sides to a total thickness of about 150-175 μm. A mixed (yellow and red) phosphor consisting of 97% $Y_3Al_5O_{12}$:Ce and 3% $SrCaSi_5N_8$:Eu (by weight) was brushed or dusted/sprayed on the two adhesive surfaces until a full coverage was achieved and no more phosphor particles would stick to the surface. The loose particles were then brushed or blown off and the phosphor sheet was tested by placing it on top of a blue LED. The resulting spectrum is shown in FIG. 6 as curve 604, and the color performance is given in Table 1 above. This example has less residual blue light and a converted light peak shifted more toward the red compared to Example 1. The CRI is improved, although the color temperature is lower and the conversion efficiency is somewhat less than for Example 1.

Example 3

A thin PET substrate was coated with an ACRYLIC adhesive on both sides to a total thickness of about 150-175 μm. A green phosphor consisting of $SrBaSiO_4$:Eu was brushed or dusted/sprayed on one side of the sheet until a full coverage was achieved and no more phosphor particles would stick to the surface. A red phosphor consisting of $SrCaSi_5N_8$:Eu was brushed or dusted/sprayed on the second adhesive surface or sheet side until a full coverage was achieved and no more phosphor particles would stick to that surface. The loose particles were brushed or blown off and the phosphor sheet was tested by placing it on top of a blue LED with the green phosphor side facing the LED. The resulting spectrum is shown in FIG. 6 as curve 606, and the color performance is given in Table 1 above. The use of two phosphors including one with substantially redder output provides greatly improved CRI, a warm-white color and a high color temperature. These benefits are achieved partly with a sacrifice in conversion efficiency.

Example 4

A thin PET substrate was coated with a silicone adhesive on both sides to a total thickness of about 150-175 μm. PET liner sheets were laminated to each side of a silicone adhesive sheet in order to completely cover the adhesive with a peelable protective sheet. A die-cutting machine was used to cut specific patterns, lettering and/or graphics on one or both sides of the liner sheets while leaving the adhesive layers intact. Selected sections of the die-cut liners were peeled off and removed to expose the adhesive layer underneath. Similar or different color phosphors and compositions such as $(Y,Gd,Lu)_3Al_5O_{12}$:Ce, $SrBaCaSiO_4$:Eu, $SrBaCaGa_2S_4$:Eu, and/or $SrBaCaSi_5N_8$:Eu were brushed or dusted/sprayed on the selected exposed adhesive sections of the sheet until a full coverage was achieved and no more phosphor particles would stick to the surface. The loose particles of each phosphor were brushed or blown off. Another section of the adhesive was then exposed and coated with a similar or different phosphor composition until a full coverage was achieved and no more phosphor particles would stick to the surface. The loose particles of were then brushed or blown off. This process could be repeated as many times as necessary on one of both sides of the adhesive sheet using as many different phosphor compositions or colors necessary to achieve a desired color pattern. Different patterns and colors can also be produced on different sheets and then laminated together or on secondary substrates for protection and handling. Such patterns and layers are not limited to phosphors and can also include non-luminescent white-colored or dark-colored optical powders in order to improve contrast or achieve a certain overall body color for the final sheet.

Figure 7:
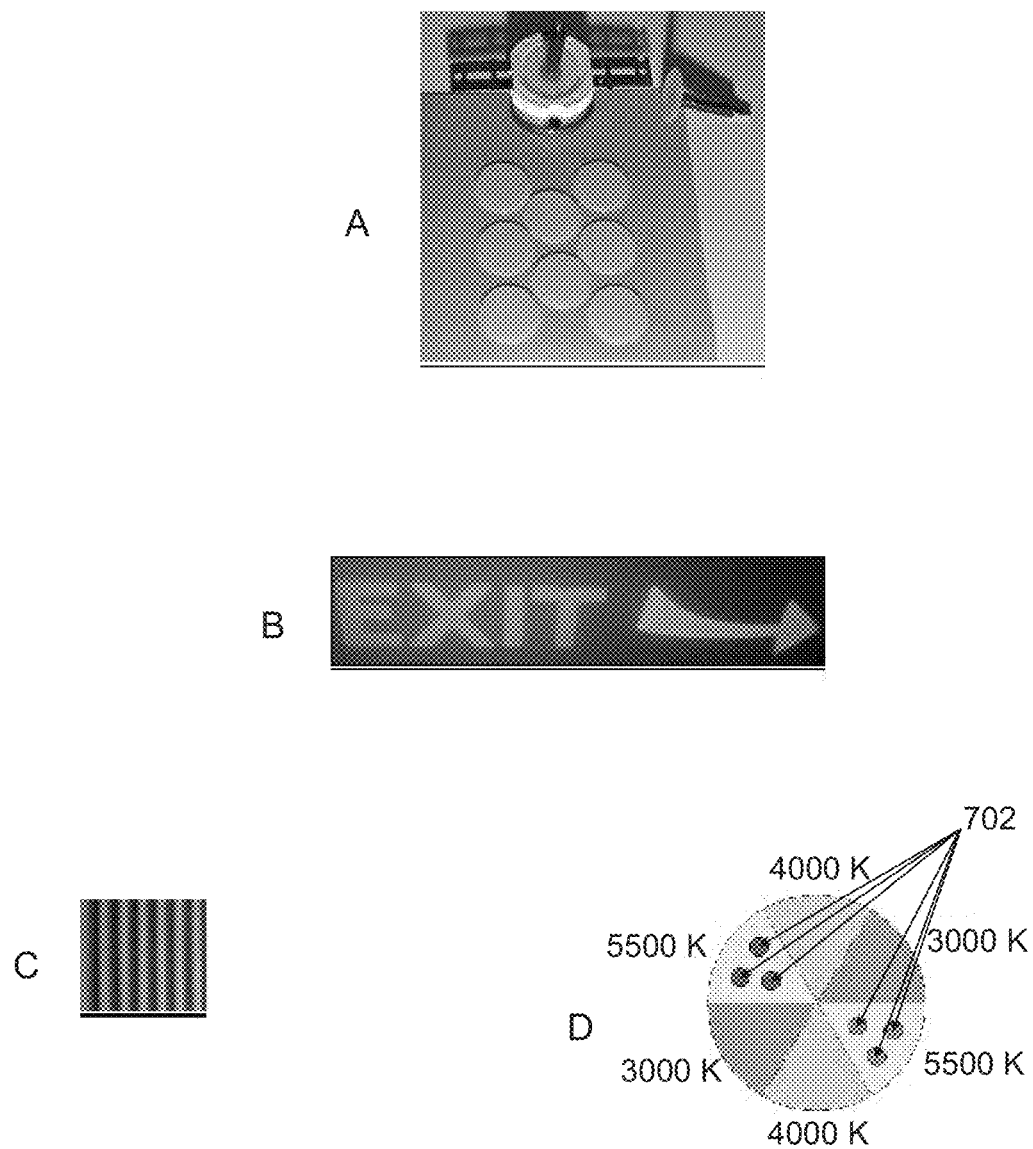
FIG. 7 shows various ways that phosphor sheets of varying color can be cut and assembled into useful products.

Various examples of patterns and laminated sheets produced using this technique are shown in FIG. 7. FIG. 7A shows yellow phosphor disks for pick-and-place assembly produced by die-cutting. FIG. 7B shows a sample multicolored sign produced using red, green, and blue phosphors (e.g., background is blue, lettering is red, and arrow is green). FIG. 7C shows a light converter with alternating stripes of different colored phosphors. Such a light converter can be used, for example, with an addressable or scannable light source to produce a light converter with programmable color. FIG. 7D shows a rotatable patterned disk with different phosphor compositions in each sector which could be used to produce a luminaire with adjustable color temperature (3000-5500 K as illustrated). For example, the disk can be positioned in front of one or several LEDs 702 and rotated to position to expose one or more sectors to light from those LEDs. A rotatable patterned disk can enable a user to customize the phosphor-converted LED color by physically turning the disk to a specific position. The disk can provide low-cost dynamic LED color control without requiring the use of multi-color LEDs to electronically control the lamp color, as is known in the art.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A light converter comprising
    a substrate having a first layer of phosphor particles disposed on an area of one surface of the substrate,
    wherein the substrate has a thickness between 25 μm and about 2 mm and consists of one or more polymers,
    wherein the first layer has a thickness of about 1 monolayer of phosphor particles, wherein a monolayer of phosphor particles is 1 particle thick and contains only phosphor particles, and
    wherein the phosphor particles in the first layer form a uniform and dense layer such that an average distance between neighboring particles is generally less than a largest dimension of a largest particle present on the surface.

2. The light converter of claim 1, wherein the thickness of the substrate is between about 50 μm and about 500 μm.

3. The light converter of claim 1, wherein a screen weight of the phosphor particles is between about 1 mg/cm² and about 40 mg/cm².

4. The light converter of claim 1, wherein the substrate comprises a base layer and a first adhesive layer.

5. The light converter of claim 1, wherein the substrate further comprises a reflective layer.

6. The light converter of claim 1, further comprising a layer of pressure-sensitive adhesive on a surface of the phosphor sheet.

7. The light converter of claim 1, further comprising a second layer of phosphor particles,
wherein the second layer of phosphor particles is disposed on a second side of the substrate,
wherein the second layer of phosphor particles has a thickness of about 1 monolayer, and
wherein the phosphor particles in the second layer form a uniform and dense layer.

8. The light converter of claim 1, wherein the substrate comprises a polymer.

9. The light converter of claim 1, wherein the substrate is transparent or reflective.

10. The light converter of claim 1, wherein the phosphor particles absorb light having a peak wavelength between about 360 nm and about 490 nm and emit light having a peak emission wavelength longer than the peak wavelength of the absorbed light.

11. The light converter of claim 1, wherein the phosphor particles comprise two or more materials, each material having a peak emission wavelength distinct from the peak emission wavelength of each other material.

12. The light converter of claim 11, wherein the two or more materials are mixed within a phosphor layer.

13. The light converter of claim 11, wherein the two or more materials are disposed in separate phosphor layers.

14. The light converter of claim 11, wherein the two or more materials are disposed on separate and discrete areas of the phosphor sheet.

15. A light emitting device comprising the light converter of claim 1, further comprising a light source having a peak emission wavelength between about 360 nm and about 490 nm.

16. A method of forming a light converter comprising
providing a substrate having an adhesive surface, wherein the substrate has a thickness between 25 μm and about 2 mm and consists of one or more polymers, and
forming a first layer of phosphor particles on the adhesive surface of the substrate;
wherein the first layer has a thickness of about 1 monolayer of phosphor particles, wherein a monolayer of phosphor particles is 1 particle thick and contains only phosphor particles, and
wherein the phosphor particles in the first layer form a uniform and dense layer such that an average distance between neighboring particles is generally less than a largest diameter of a largest particle present on the adhesive surface.

17. The method of claim 16, wherein the adhesive surface is provided by forming a first adhesive layer on an area of the substrate.

18. The method of claim 16, wherein the forming a first layer of phosphor particles comprises dry dusting, spraying, or brushing phosphor particles onto the adhesive layer.

19. The light emitting device of claim 15, wherein the light source comprises a light emitting diode.

20. The light emitting device of claim 15, wherein the light source comprises a laser.

* * * * *